United States Patent
Laskaris et al.

(10) Patent No.: US 6,995,562 B2
(45) Date of Patent: Feb. 7, 2006

(54) CONDUCTION COOLED PASSIVELY-SHIELDED MRI MAGNET

(75) Inventors: Evangelos Laskaris, Schenectady, NY (US); Xianrui Huang, Clifton Park, NY (US); Michele Dollar Ogle, Burnt Hills, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/898,182

(22) Filed: Jul. 26, 2004

(65) Prior Publication Data

US 2005/0001621 A1 Jan. 6, 2005

Related U.S. Application Data

(62) Division of application No. 10/248,169, filed on Dec. 23, 2002, now Pat. No. 6,783,059.

(51) Int. Cl.
*G01V 3/00* (2006.01)

(52) U.S. Cl. .................................... 324/318; 324/307

(58) Field of Classification Search ............... 324/318, 324/319, 322, 309, 307, 300; 335/299
See application file for complete search history.

(56) References Cited

U.S. PATENT DOCUMENTS

| | | | |
|---|---|---|---|
| 4,291,541 A * | 9/1981 | Kneip et al. ............. | 62/51.1 |
| 4,310,799 A | 1/1982 | Hutchison et al. | |
| 5,225,782 A | 7/1993 | Laskaris et al. | |
| 5,285,181 A | 2/1994 | Laskaris et al. | |
| 5,304,934 A | 4/1994 | Laskaris et al. | |
| 5,406,204 A * | 4/1995 | Morich et al. ........... | 324/318 |
| 5,461,873 A * | 10/1995 | Longsworth ............. | 62/51.1 |
| 5,874,880 A | 2/1999 | Laskaris et al. | |
| 5,874,882 A | 2/1999 | Laskaris et al. | |
| 5,883,558 A | 3/1999 | Laskaris et al. | |
| 5,994,991 A | 11/1999 | Laskaris et al. | |
| 5,999,075 A | 12/1999 | Laskaris et al. | |
| 6,150,819 A | 11/2000 | Laskaris et al. | |
| 6,157,279 A | 12/2000 | Laskaris et al. | |
| 6,166,617 A | 12/2000 | Laskaris et al. | |
| 6,172,588 B1 | 1/2001 | Laskaris et al. | |
| 6,783,059 B2 * | 8/2004 | Laskaris et al. ......... | 324/318 |

FOREIGN PATENT DOCUMENTS

| | | |
|---|---|---|
| DE | 195 27 150 A1 | 1/1997 |
| EP | 0 307 072 A2 | 3/1989 |
| EP | 0 416 959 A1 | 3/1991 |
| EP | 0 629 875 A1 | 12/1994 |
| GB | 2 282 451 A | 4/1995 |

OTHER PUBLICATIONS

"Enhancement of the critical current density and flux pinning of $MgB_2$ superconductor by nanoparticle SiC doping" article by S.X. Dou et al.

* cited by examiner

*Primary Examiner*—Brij B. Shrivastav
(74) *Attorney, Agent, or Firm*—Jean K. Testa; Christian G. Cabou

(57) ABSTRACT

A magnetic resonance imaging (MRI) device for imaging a volume is provided with at least one main magnet for generating a magnetic field, and at least one gradient coil for manipulating the magnetic field generated by the at least one main magnet to image the volume. The magnetic fields generated by the at least one gradient coil are substantially unshielded.

8 Claims, 5 Drawing Sheets

CONDUCTION COOLED PASSIVELY-SHIELDED MRI MAGNET

BACKGROUND OF THE INVENTION

The present invention relates generally to magnetic resonance imaging (MRI) devices, and more particularly to MRI devices including at least one gradient coil for manipulating the magnetic field generated by the MRI magnet, wherein the magnetic fields generated by the gradient coil are substantially magnetically unshielded.

MRI devices are widely used in the medical community as a diagnostic tool for imaging items such as tissue and bone structures. Conventional MRI devices are described, for example, in U.S. Pat. Nos. 5,225,782; 5,285,181; and 5,304,934 which are all incorporated by reference herein in their entirety.

As shown in FIG. 1, known superconducting (SC) MRI devices 10 typically employ windings 30 for generating a homogeneous magnetic field in an image volume 20, the windings 30 operating in liquid helium to maintain the temperature at approximately 4° K. The liquid helium pool requires a vessel 40 which is vacuum tight and which meets American Society of Mechanical Engineering (ASME) pressure vessel requirements; such a vessel 40 is typically made of welded aluminum alloy cylinders and flanges. Thermal radiation shields (not shown), of which two are typically used, are also made of welded aluminum pieces and contain the helium vessel 40.

When the gradient coils 50 in the bore of the MRI device 10 are electrically pulsed, the resulting time changing magnetic flux in any of the electrically conducting cylinders surrounding the gradient coils induces eddy currents. These eddy currents in turn produce their own magnetic fields which degrade the quality of the desired gradient field in space and time. A second set of gradient coils 60 (i.e., shield gradient coils) in the magnet bore compensate for the aggressive pulse sequences which are routinely used in MR imaging today. These shield gradient coils 60 set up fields which counteract those of the main gradient coil 50 in the region outside of the shield coil 60, thus greatly reducing any mutual inductance with conducting members, such as the thermal shields, and minimizing the resultant eddy currents. The present inventors have found that, in a typical implementation, the shield coils 60 generally cancel about 50% of the magnetic field produced by the gradient coils 50.

A need exists, however, for a MRI device 10 which reduces the amount of resultant eddy currents produced in the MRI device 10 by the gradient coils 50 in systems without the shield coils 60, or, for systems with shield coils, further reduces the amount of resultant eddy currents in the MRI device.

BRIEF SUMMARY OF THE INVENTION

The present invention is directed at reducing or eliminating one or more of the problems set forth above, and other problems found within the prior art.

According to one embodiment of the present invention, a magnetic resonance imaging (MRI) device for imaging a volume is provided comprising at least one main magnet for generating a magnetic field, and at least one gradient coil for manipulating the magnetic field generated by the at least one main magnet to image the volume, wherein the magnetic fields generated by the at least one gradient coil are substantially unshielded.

Preferably, the main magnet comprises at least one superconducting coil operating at cryogenic temperatures. More preferably, the main magnet further comprises at least one cooling tube abutting superconducting coil layers, the cooling tube being coupled to a cryocooler heat exchanger.

According to one aspect of the present invention, the main magnet may include a composite vacuum vessel enshrouding the at least one superconducting coil, the composite vacuum vessel being formed of a material wherein eddy currents are not substantially induced therein by the magnetic fields generated by the at least one gradient coil.

According to another aspect of the present invention, the main magnet is inductively isolated from the gradient coil.

According to another aspect of the present invention, the MRI device further comprises at least one cooled thermal spreader. Preferably, the cooled thermal spreader comprises at least one of a cooled thermal shield, and a cooled coil former on which a superconducting coil is wound. The cooled coil former preferably comprises a composite material including fiberglass, epoxy, and copper wire.

According to another aspect of the present invention, the MRI device further comprises a cryocooler heat exchanger thermally coupled to the at least one magnet, and a cryorefrigerator for cooling a cooling medium used by the cryocooler heat exchanger. Preferably, the cryorefrigerator is positioned substantially outside of the magnetic fields generated by the at least one gradient coil. The cooling medium may comprise one of liquid helium, liquid hydrogen, liquid nitrogen, and liquid neon.

According to another aspect of the present invention, the gradient coil comprises a plurality of epoxy-glass layers, and a plurality of insulated copper wire layers.

According to another aspect of the present invention, the MRI device further comprises at least one passive shield for passively shielding an external fringe magnetic field of the at least one magnet, the at least one passive shield being comprised of a plurality of laminated magnetizable rings. The plurality of laminated rings suppress eddy currents generated within the at least one passive shield.

According to another embodiment of the present invention, a magnetic resonance imaging (MRI) device for imaging a volume is provided comprising means for generating a main magnetic field, and means for manipulating the main magnetic field to image the volume, wherein the means for manipulating generates magnetic fields which are substantially unshielded.

According to one aspect of the present invention, the MRI device further comprises means for cryocooling the means for generating a main magnetic field without substantially inducing eddy currents within the means for cryocooling.

According to another aspect of the present invention, the MRI device further comprises means for passively shielding the means for generating a main magnetic field.

According to another embodiment of the present invention, a magnetic resonance imaging (MRI) system is provided comprising a superconductor magnet for generating a magnetic field for imaging a volume, an unshielded gradient coil for manipulating the magnetic field, and a cryocooling system thermally coupled to the superconductor magnet.

According to one aspect of the present invention, the cryocooling system comprises a cryocooler heat exchanger thermally coupled to the superconductor magnet, and a cryorefrigerator for cooling a cooling medium used by the cryocooler heat exchanger. Preferably, the cryorefrigerator is positioned external to the superconductor magnet.

According to another embodiment of the present invention, a magnetic resonance imaging (MRI) device for imaging a volume is provided comprising at least one superconducting coil operating at cryogenic temperatures for generating a magnetic field, and at least one gradient coil for manipulating the magnetic field generated by the at least one main magnet to image the volume. The at least one superconducting coil includes at least one cooling tube abutting superconducting coil layers, the at least one cooling tube being coupled to a cryocooler heat exchanger.

According to another embodiment of the present invention, a magnetic resonance imaging (MRI) device for imaging a volume is provided comprising at least one main magnet for generating a magnetic field, at least one gradient coil for manipulating the magnetic field generated by the at least one main magnet to image the volume, and at least one cooled thermal spreader. The cooled thermal spreader comprises at least one of a cooled thermal shield, and a cooled coil former on which the at least one main magnet is wound.

DETAILED DESCRIPTION OF THE INVENTION

Reference will now be made in detail to presently preferred embodiments of the present invention. Wherever possible, the same reference numbers will be used throughout the drawings to refer to the same or like parts.

The reduction of eddy currents according to an embodiment of the present invention may be accomplished through the implementation of eddy current free components in the MRI device 200. Such eddy current free components can be used to eliminate or reduce any residual eddy currents generated, as present shield coils still allow about 50% of the magnetic field produced by the gradient coils through. By way of example, eddy current free components can be used as part of a cooled thermal spreader, such as a cooled thermal shield or a cooled coil former. Other components may also be made wholly or partly from eddy current free/resistant materials.

Figure 2:
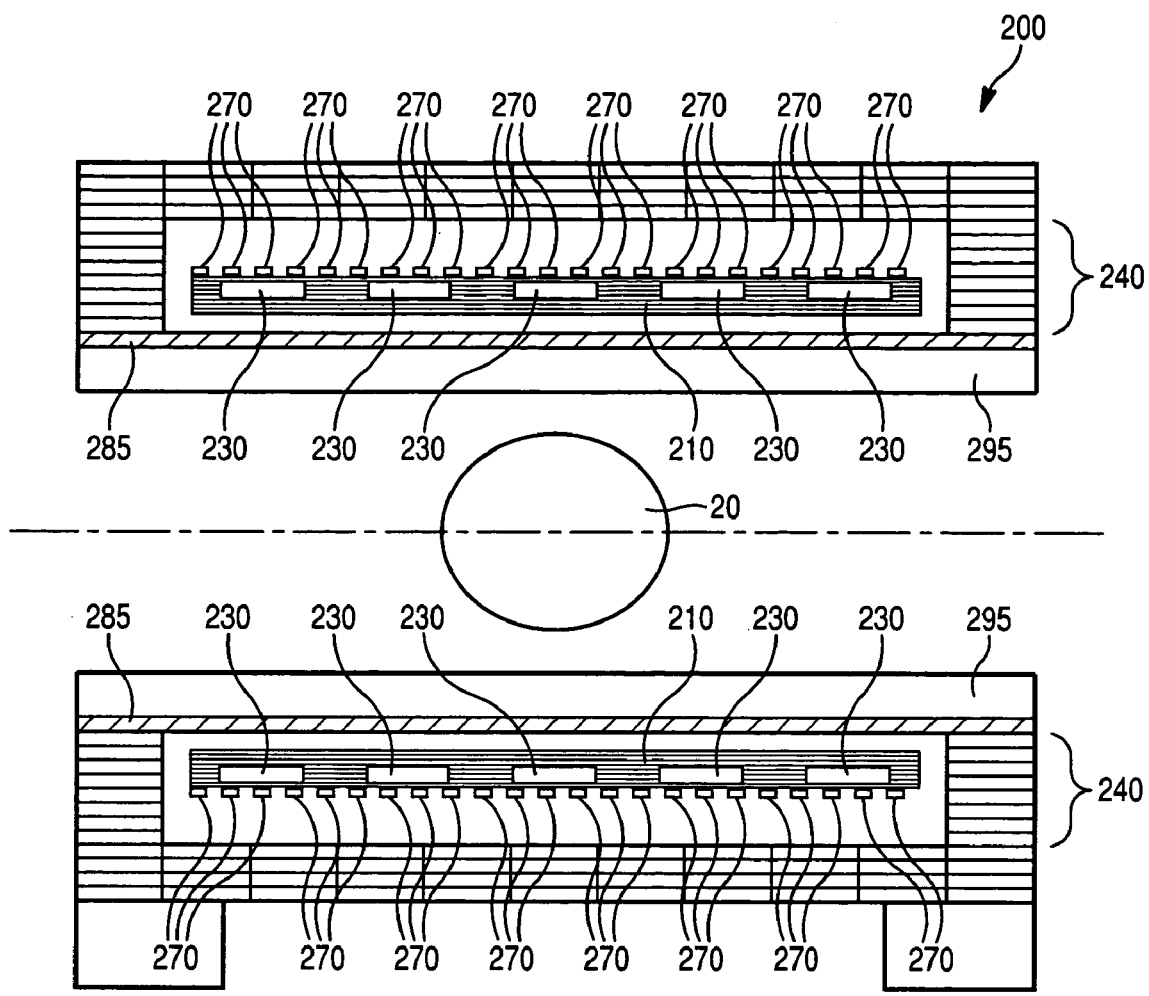
FIG. 2 is a cross sectional view of a MRI device according to an embodiment of the present invention.

One such MRI magnet 200 is shown in the block diagram of FIG. 2. According to this embodiment, a thermosiphon convection cooled coil former 210 is provided with the main MRI magnet (i.e., superconducting coils 230) for thermally shielding and/or cooling the main MRI magnet. Preferably the coil former 210 is made of a composite material comprising an epoxy-glass copper-wire composite material; however, other materials such as replacing copper with aluminum, etc. could also be used. Hence, it should be appreciated that the coil former 210 (and thermal shield cylinder 810 in FIGS. 5 and 6) are preferably made of a material in which eddy currents are not substantially produced during operation of the unshielded gradient coils 295.

The bore 285 of the vacuum vessel is also made substantially of eddy current free materials.

Figure 3:
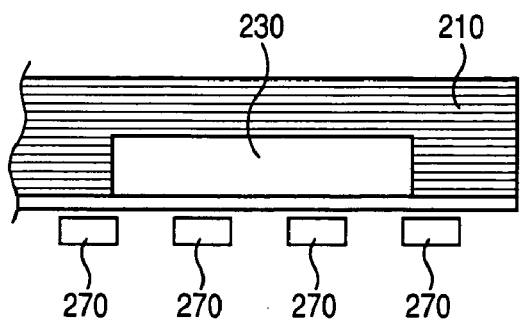
FIG. 3 is an enlarged view of a portion of a cooled coil former according to an embodiment of the present invention.
Figure 5:
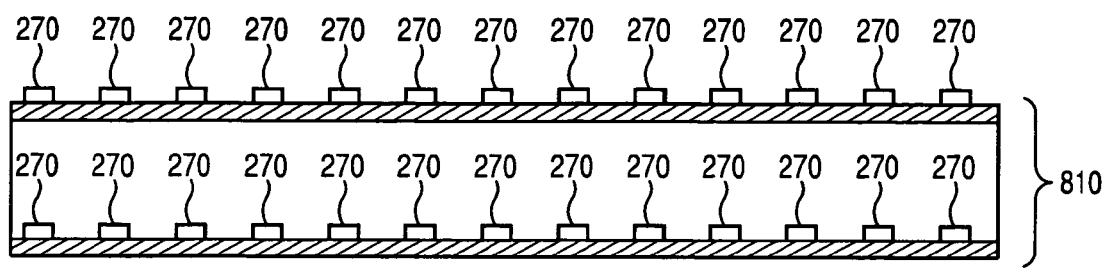
FIG. 5 is a cross sectional view of a cylindrical cooled thermal shield according to an embodiment of the present invention.
Figure 5:
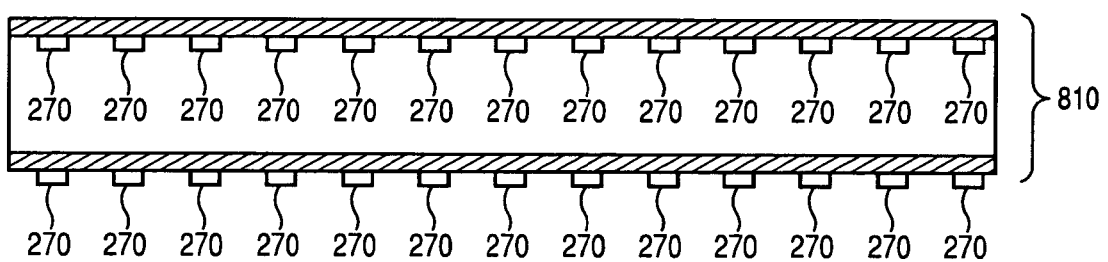
Figure 6:
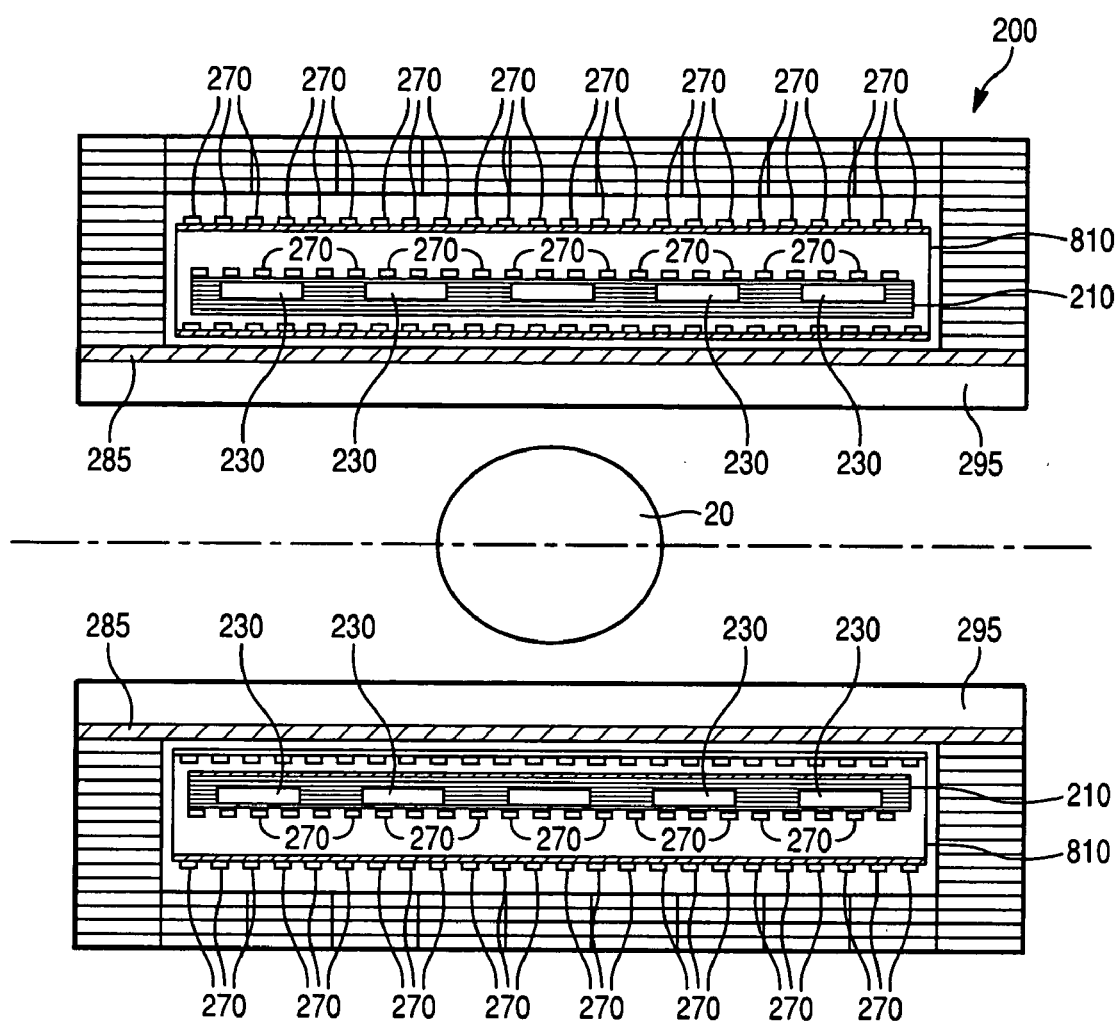
FIG. 6 is a cross sectional view of a MRI device with both a cooled coil former and a cylindrical cooled thermal shield according to an embodiment of the present invention.

As shown in FIGS. 2 and 3, one or more cooling tubes 270 are mounted on the coil former 210. Similarly, as shown in FIGS. 5 and 6, one or more cooling tubes 270 may also be mounted on the thermal shield 810 (if provided). Preferably, the cooling tubes 270 are wrapped substantially around the coil former 210 and/or the thermal shield cylinder 810.

The cooling tubes 270 are configured to pass a cooling medium (e.g., liquid helium, liquid hydrogen, liquid nitrogen, liquid neon, etc.) about the coil former 210 and/or thermal shield cylinder 810, thereby cooling the coil former 210 and/or thermal shield cylinder 810, the cooling medium chosen to have a temperature lower than the superconductor critical temperature required by the combination of current density and magnetic field at which the superconductor will be operating in. Hence, the cooling tubes 270 are coupled to a cryorefrigerator 280 (FIG. 4) via a coolant flow circuit (not shown). It should be appreciated that the size and number of tubes of the cooling tubes 270 depends on many heat transfer design details including, but not limited to, overall size, flow rate and resistance, materials, and the heat load of the MRI device 200.

Figure 4:
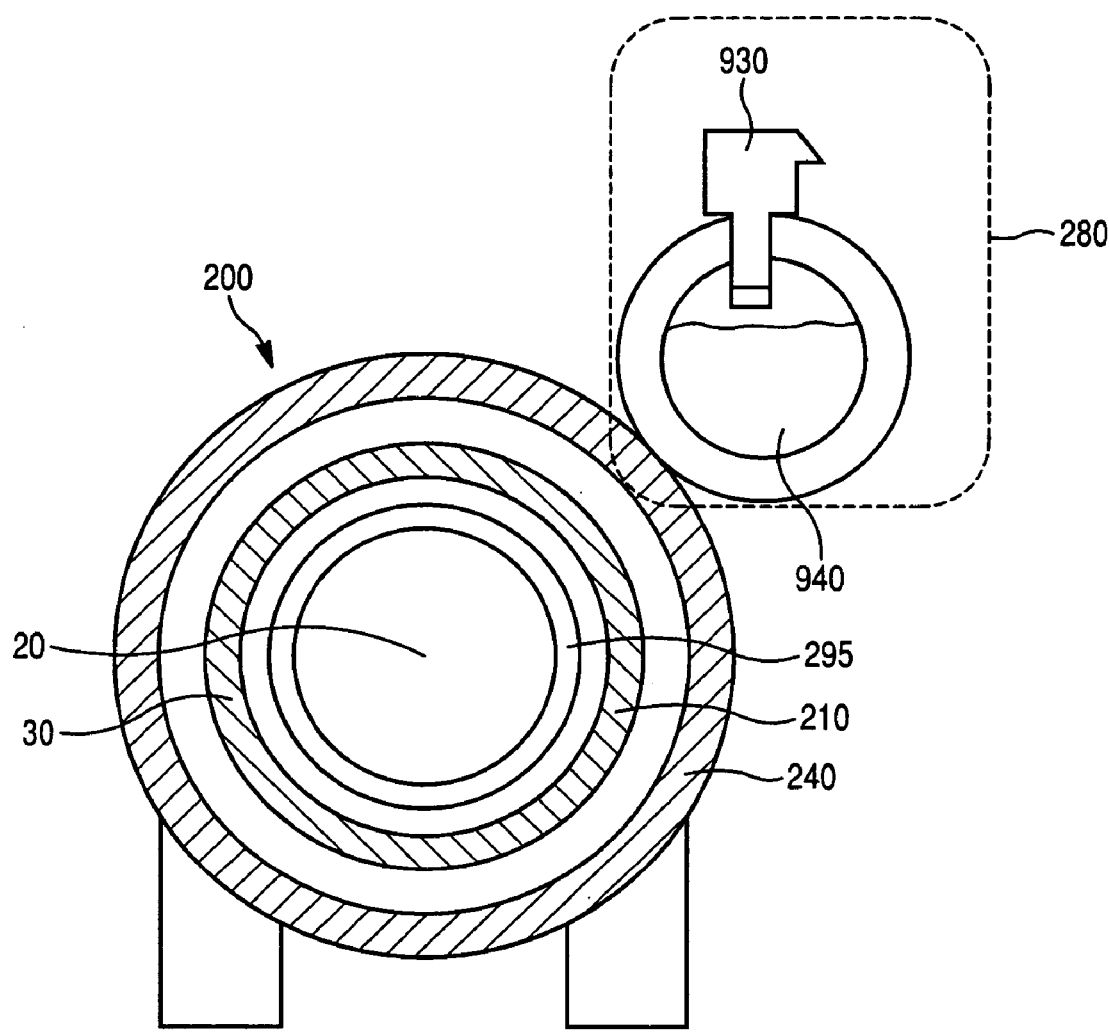
FIG. 4 is an end view of a MRI device according to an embodiment of the present invention.

Cooling is provided by circulating the cooling medium through the MRI device 200, where cold cooling medium heat exchanges with the coil former 210 and/or thermal shield cylinder 810 via the cooling tubes 270, and returns back to the cryorefrigerator 280 at a higher temperature. As known cryorefrigerator designs are limited on the types of materials employable therein due, in part, to the extreme thermal operating conditions, the use of non-metallic "eddy current free" materials is also limited. Hence, the cryorefrigerator 280 is preferably positioned external to the MRI device 200 as shown in FIG. 4. This isolates the cryorefrigerator 280 from the fluctuating electric and magnetic fields generated by the MRI device 200, thereby preventing generation of eddy currents within the cryorefrigerator 280. Fluid circulation may be generated by utilizing the difference in gravitational forces between the cold and the warm ends, or alternatively by way of a pump (not shown).

Cooling medium container 940 is used to store the liquid cooling medium needed for operation. To minimize any generated eddy current, the container 940 is preferably composed of a thin stainless steel shell to form the pressure boundary and a fiberglass composite structure wrapped around the stainless steel to support the pressure load. Details of the coldhead 930 shown in FIG. 4 are dependent upon the particular implementation.

Figure 1:
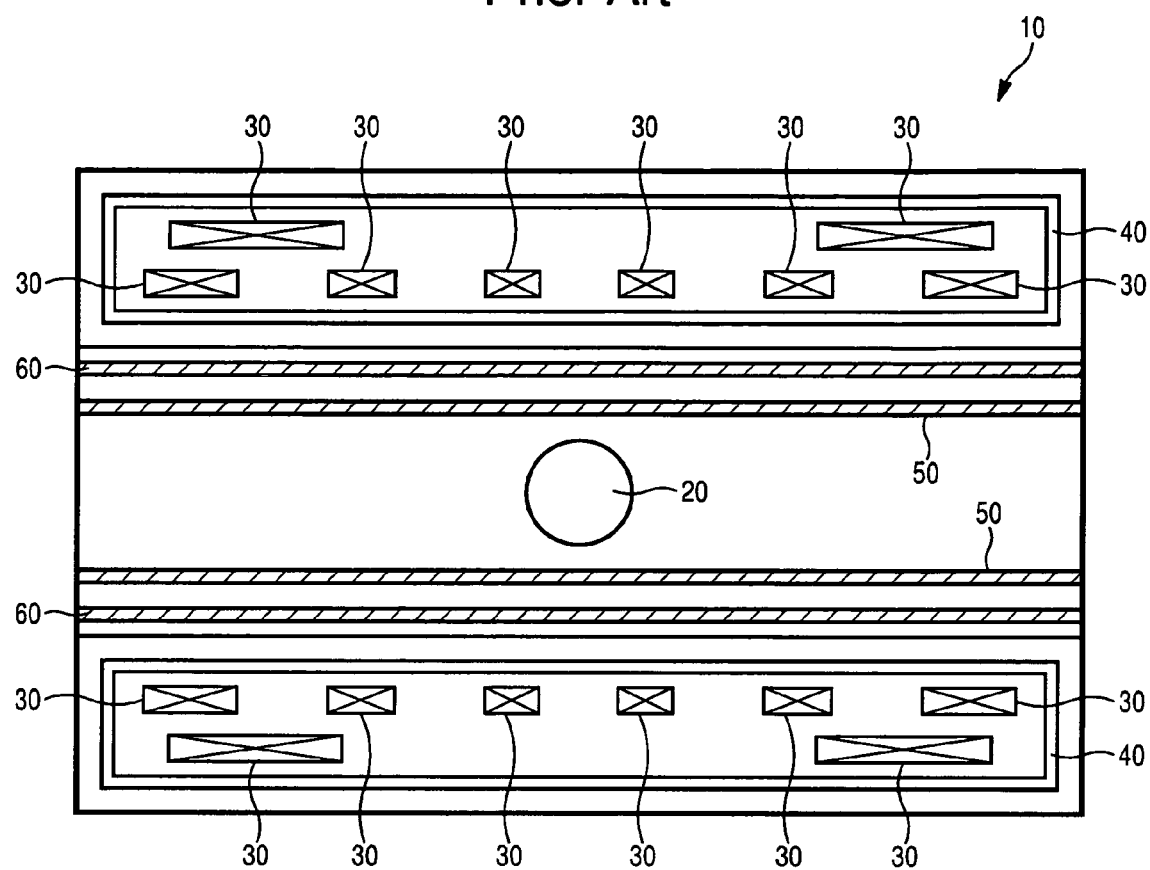
FIG. 1 is a cross sectional view of a known MRI device.

The aforementioned configuration has reduced eddy currents generated therein by moving a portion of the cryorefrigeration system (e.g., the cryorefrigerator 280) outside of the MRI magnet 200, and by using non-metallic materials (e.g., composite materials) for at least some of the MRI components. The reduced eddy current generation allows for elimination of the shield gradient coils 60 (FIG. 1), or for further reduced eddy currents in configurations with shield gradient coils 60. Hence, any one of or a combination of the aforementioned features may be utilized to improve upon a known MRI device 10.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A magnetic resonance imaging (MRI) system, comprising:
    a superconductor magnet for generating a magnetic field for imaging a volume;
    an unshielded gradient coil for manipulating the magnetic field;
    at least one cooling tube mounted adjacent to the superconductor magnet for cooling the superconductor magnet; and
    a cryocooling system thermally coupled to said at least one cooling tube.

2. The MRI system of claim 1, further comprising at least one passive shield for passively shielding an external fringe magnetic field of said superconductor magnet, said at least one passive shield being comprised of:
    a plurality of laminated magnetizable rings,
    wherein said plurality of laminated rings suppress eddy currents generated within said at least one passive shield.

3. The MRI system of claim 2, wherein said cryocooling system comprises:
    a cryorefrigerator for cooling a cooling medium used by said at least one cooling tube.

4. The MRI system of claim 3, wherein said cryorefrigerator is positioned external to said superconductor magnet.

5. The MRI system of claim 1, further comprising:
    at least one cooled thermal spreader, said at least one cooled thermal spreader comprising one of:
        a cooled thermal shield, and
        a cooled coil former on which said superconductor magnet is wound.

6. The MRI system of claim 5, wherein said cooled thermal shield comprises:
    a shield cylinder; and
    the at least one cooling tube is wrapped around said shield cylinder, said at least one cooling tube being coupled to the cryocooling system.

7. The MRI system of claim 6, wherein said shield cylinder comprises:
    an epoxy-glass copper-wire composite material.

8. A magnetic resonance imaging (MRI) device for imaging a volume, comprising:
    at least one superconducting coil operating at cryogenic temperatures for generating a magnetic field; and
    at least one gradient coil for manipulating the magnetic field generated by said at least one superconducting coil to image said volume,
    wherein said at least one superconducting coil includes at least one cooling tube abutting superconducting coil layers, said at least one cooling tube being coupled to a cryocooling system.

* * * * *